United States Patent
Shin'e

[11] Patent Number: 6,072,816
[45] Date of Patent: Jun. 6, 2000

[54] LASER-DIODE DRIVE CIRCUIT

[75] Inventor: Toshifumi Shin'e, Tokyo, Japan

[73] Assignee: NEC Corporation, Tokyo, Japan

[21] Appl. No.: 09/023,085

[22] Filed: Feb. 13, 1998

[30] Foreign Application Priority Data

Feb. 13, 1997 [JP] Japan .................................. 9-044757

[51] Int. Cl.⁷ .................................................. H01S 3/096
[52] U.S. Cl. .................................................. 372/38; 372/43
[58] Field of Search ........................... 372/34, 38, 43–48

[56] References Cited

U.S. PATENT DOCUMENTS

| | | | |
|---|---|---|---|
| 4,243,952 | 1/1981 | Patterson | 372/38 X |
| 4,484,331 | 11/1984 | Miller | 372/38 |
| 4,594,717 | 6/1986 | Bracht et al. | 372/38 |
| 4,683,573 | 7/1987 | Albanese | 372/34 |
| 5,043,992 | 8/1991 | Royer et al. | 372/38 |
| 5,315,606 | 5/1994 | Tanaka | 372/38 |
| 5,651,017 | 7/1997 | Genovese | 372/38 |
| 5,736,844 | 4/1998 | Yanagisawa | 372/38 X |
| 5,761,230 | 6/1998 | Oono et al. | 372/38 |
| 5,793,786 | 8/1998 | Furumiya | 372/38 |

FOREIGN PATENT DOCUMENTS

| | | |
|---|---|---|
| 64-55884 | 3/1989 | Japan . |
| 1-115181 | 5/1989 | Japan . |
| 2-78287 | 3/1990 | Japan . |
| 4-239188 | 8/1992 | Japan . |
| 4-275473 | 10/1992 | Japan . |
| 5-130619 | 5/1993 | Japan . |
| 5-259546 | 10/1993 | Japan . |
| 7-46194 | 2/1995 | Japan . |
| 7-94814 | 4/1995 | Japan . |

*Primary Examiner*—John D. Lee
*Attorney, Agent, or Firm*—Sughrue, Mion, Zinn, Macpeak & Seas, PLLC

[57] ABSTRACT

A laser-diode drive circuit which maintains the speed of an optical output power waveform even if the pulsed current waveform of the laser diode changes. The laser diode drive circuit includes a differential transistor pair whose emitted electrodes are connected together, emitter-follower transistors for driving the differential transistor pair, a bias current supply transistor for supplying the laser diode with a bias current, a current source transistor serving as the current source of the differential transistor pair, and an automatic power control circuit. The collector electrode of one of the transistors of the differential transistor pair is connected to both the collector electrode of the bias current supply transistor and the cathode electrode of the laser diode. Current control transistors are provided for setting the currents of the emitter-follower transistors. The bias current supply transistor, the current source transistor and the base electrodes of the first and second current control transistors are connected to the control voltage output of the automatic power control circuit.

6 Claims, 2 Drawing Sheets

LASER-DIODE DRIVE CIRCUIT

FIELD OF THE INVENTION

This invention relates to a circuit for driving a laser diode and, more particularly, to a drive circuit for driving a laser diode at high speed, such a drive circuit being ideal for use in an optical transmitter for fiber-optic communications.

BACKGROUND OF THE INVENTION

Relating to the related art following discussions are presented.

In a conventional circuit for driving a laser diode, a transistor serving as the current source of a differential transistor pair is controlled by the output voltage of an APC circuit (automatic power control circuit), whereby the pulsed driving current of the laser diode is adjusted in dependence upon a change in ambient temperature. FIG. 2 is a diagram illustrating an example of the construction of such a laser-diode drive circuit.

As shown in FIG. 2, the conventional laser-diode drive circuit includes a differential transistor pair 1 comprising a pair of transistors whose emitter electrodes are connected together, emitter-follower transistors 2 and 3 for supplying a base voltage to each of the transistors of the differential transistor pair 1, a transistor 4 for supplying a bias current to a laser diode 13, a transistor 5 serving as the current source of the differential transistor pair 1, emitter resistors 10, 11, 8 and 9 which are connected to transistors 2, 3, 4 and 5, respectively, and to a low-potential side of a power supply, an APC circuit 12, and the laser diode 13.

The collector electrode of one transistor of the differential transistor pair 1 and the collector electrode of the transistor 4 which supplies the bias current to the laser diode are both connected to the cathode electrode of the laser diode 13, the collector electrode of the current-source transistor 5 is connected to the common emitter electrodes of the differential transistor pair 1, and the base electrodes of the transistors 4 and 5 are-connected to the control output side of the APC circuit 12.

SUMMARY OF THE INVENTION

When the bias driving current of the laser diode 13 is increased or decreased in the conventional laser-diode drive circuit shown in FIG. 2, the band of the differential transistor pair 1 for driving the laser diode changes with respect to a change in the pulsed current waveform of the laser diode. Consequently, the waveform of the optical output power changes as a result of a change in ambient temperature.

Accordingly, an object of the present invention is to provide a laser-diode drive circuit which is capable of maintaining the speed of the optical output power waveform even if the pulsed current waveform of the laser diode varies.

Further objects of the present invention will become apparent from the entire disclosure.

According to one aspect of the present invention, the foregoing object is accomplished by providing a novel circuit for driving a laser diode. The laser diode (LD) driving circuit comprises a differential transistor pair for supplying the laser diode with a driving current, a transistor for supplying the laser diode with a bias current, and emitter-follower transistors for driving the differential transistor pair. A pulsed driving current for driving the laser diode in alternating-current fashion is controlled by APC voltage. In the LD driving circuit, even in a case where the pulsed driving current of the differential transistor pair changes and operating speed of the differential transistor pair fluctuates, operating speed of the emitter-follower transistors can be varied by controlling a current, which flows into the emitter-follower transistors, by the APC voltage. In this manner, the amount of fluctuation in the operating speed of the differential transistor pair is eliminated.

According to another aspect of the present invention, the foregoing object is accomplished by providing a novel circuit for driving a laser diode. The LD driving circuit comprises a differential transistor pair comprising a pair of transistors having emitter electrodes connected together, first and second emitter-follower transistors for driving the differential transistor pair, a LD bias current supply transistor for supplying the laser diode with a bias current, a current source transistor for providing a current source to the differential transistor pair, an automatic power control circuit for outputting a control voltage, and a laser diode. The LD driving circuit further comprises a collector electrode of one of the transistors of the differential transistor pair being connected, together with a collector electrode of the bias current supply transistor, to a cathode electrode of the laser diode. There are first and second current control transistors for setting currents of the first and second emitter-follower transistors, respectively. In the LD driving circuit the LD bias current supply transistor, the current source transistor and base electrodes of the first and second current control transistors are connected to a control voltage output of the APC circuit.

In accordance with the laser-diode drive circuit according to the present invention, the speed of an optical output power waveform can be maintained even if the pulsed current waveform of the laser diode changes.

Other features and advantages of the present invention will be apparent from the following description including the claims taken in conjunction with the accompanying drawings, in which like reference characters designate the same or similar parts throughout the figures thereof.

DESCRIPTION OF THE PREFERRED EMBODIMENT

A preferred embodiment of a circuit for driving a laser diode according to the present invention will be described with reference to FIG. 1.

Figure 1:
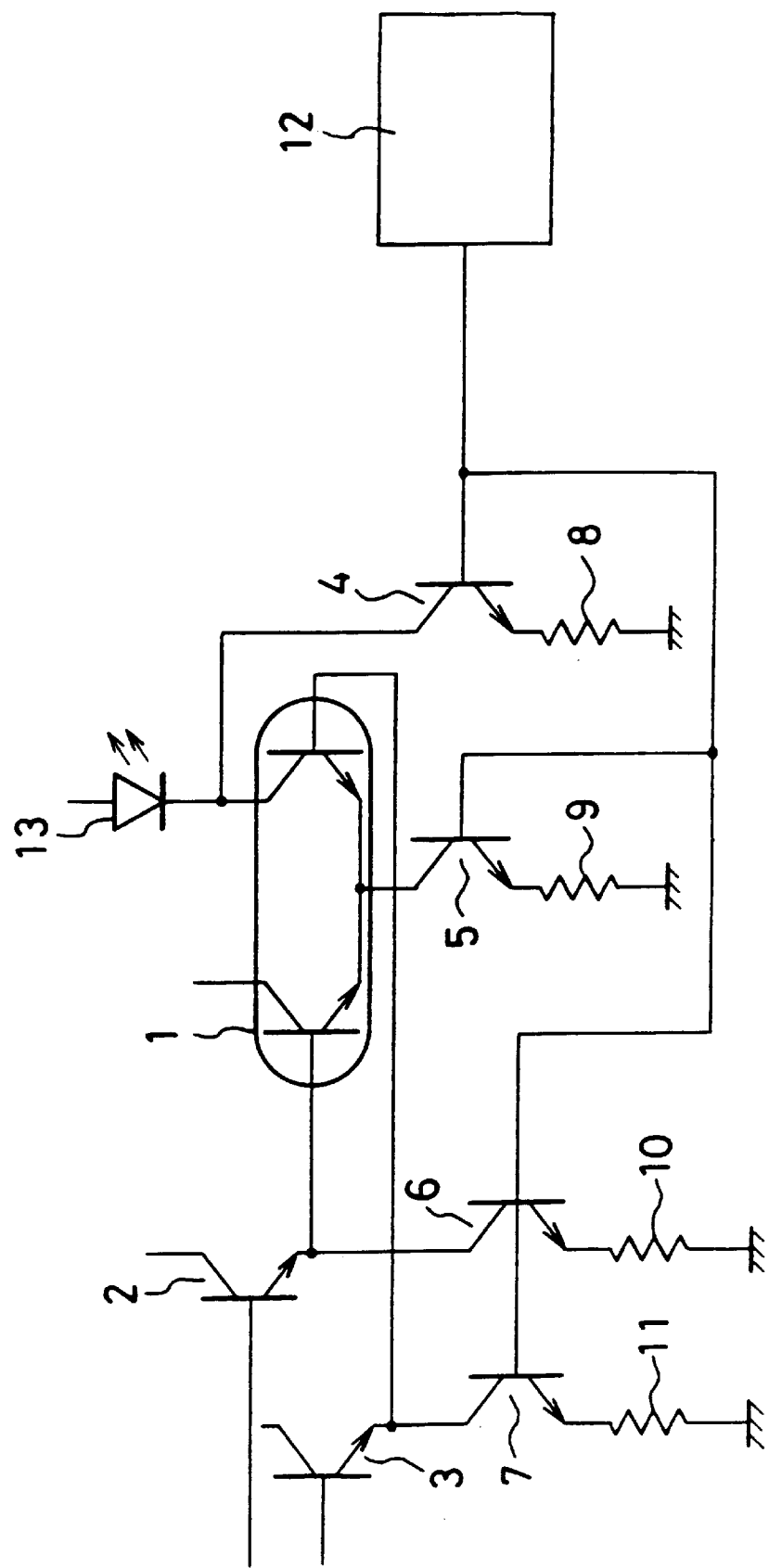
FIG. 1 is a diagram illustrating the circuit construction of a laser-diode (LD) drive circuit according to an embodiment of the present invention.
Figure 2:
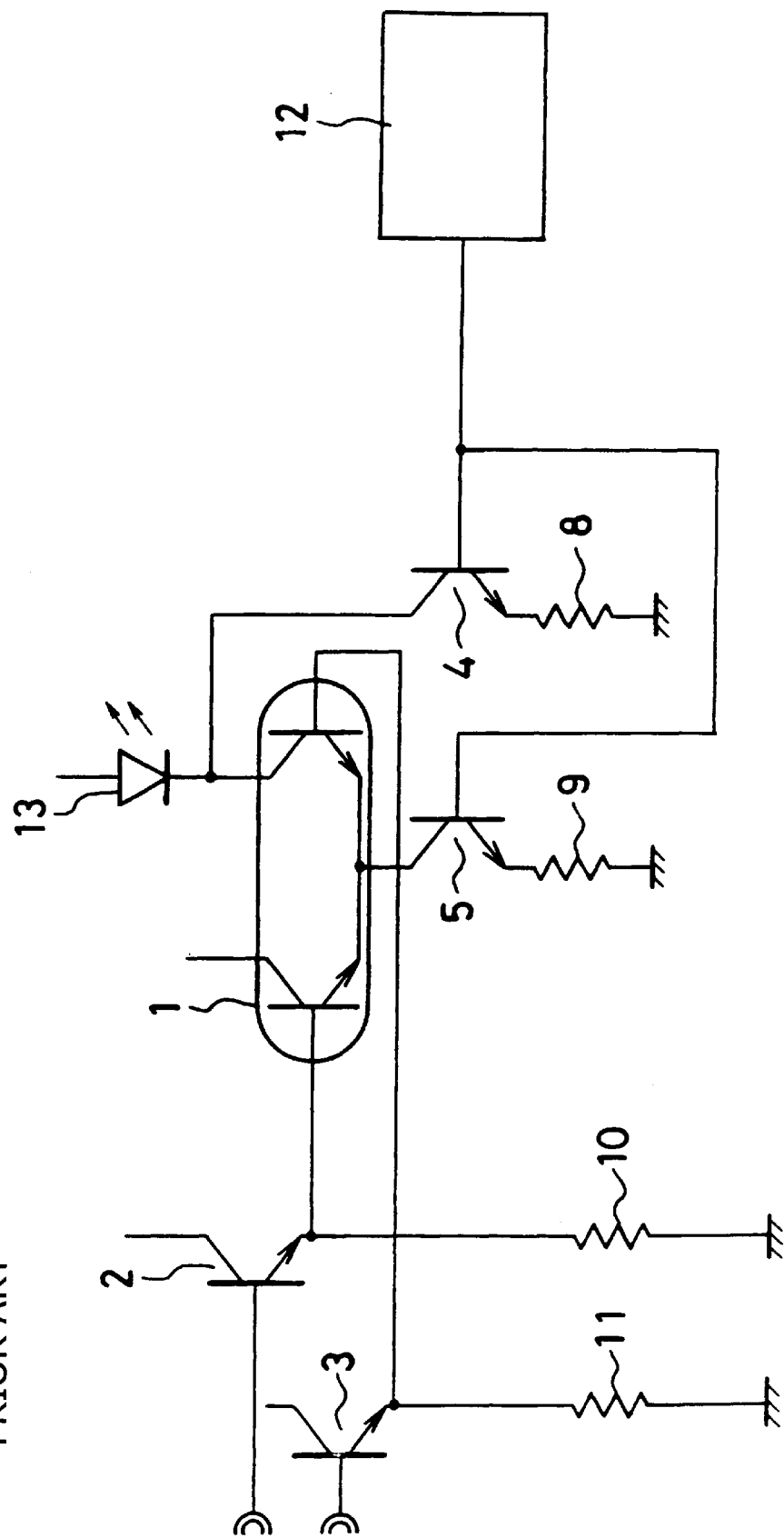
FIG. 2 is a diagram illustrating the circuit construction of a laser-diode drive circuit according to the prior art.

FIG. 1 is a diagram illustrating the circuit construction of a laser-diode drive circuit according to an embodiment of the present invention.

As shown in FIG. 1, the drive circuit includes a differential transistor pair 1 comprising a pair of transistors having their emitter electrodes connected together, first and second emitter-follower transistors 2 and 3 for driving the differential transistor pair 1, a LD bias current supply transistor 4 for supplying a laser diode 13 with a bias current, a current source transistor 5 providing a current source for the differential transistor pair 1, and an APC circuit 12 for outputting a control voltage. A collector electrode of one of the transistors of the differential transistor pair 1 is connected to both a collector electrode of the bias current supply transistor 4 and a cathode electrode of the laser diode 13. The drive circuit further includes first and second current control transistors 6 and 7 connected to the first and second emitter-follower transistors 2 and 3, respectively, for setting the currents thereof. The LD bias current supply transistor 4, the current source transistor 5 and the base electrodes of the first and second current control transistors 6 and 7 are connected to the control voltage output of the APC circuit 12. The emitter currents of the emitter-follower transistors 2 and 3 which drive the differential transistor pair 1 are controlled by the control voltage output of the APC circuit 12.

More specifically, the circuit for driving the laser diode 13 includes the differential transistor pair 1 whose two emitter electrodes are interconnected, emitter-follower transistors 2 and 3 for supplying the base voltage to the differential transistor pair 1, current source transistor 5 serving as the current source of the differential transistor pair 1, transistors 6 and 7 for setting the currents which flow into the emitter-follower transistors 2 and 3, emitter resistors 8, 9, 10 and 11 of the transistors 4, 5, 6 and 7, respectively, and the APC circuit 12.

The collector electrode of one of the transistors of the differential transistor pair 1 is connected to the collector electrode of the bias current supply transistor 4 and to the cathode electrode of the laser diode 13. The collector electrode of the current source transistor 5 is connected to the emitter electrodes of both transistors of the differential transistor pair 1, the emitter electrodes of the emitter-follower transistors 2 and 3 which drive the differential transistor pair 1 are connected to the collector electrodes of the transistors 5 and 6, respectively, and the emitter electrodes of the transistors 4, 5, 6 and 7 are connected to the low-potential side of the power supply via the emitter resistors 8, 9, 10 and 11, respectively. The base electrodes of the transistors 4, 5, 6 and 7 are all commonly connected to the control voltage output of the APC circuit 12. The emitter currents of the emitter-follower transistors 2 and 3 which drive the differential transistor pair 1 are controlled by the control voltage output from the APC circuit 12.

If the ambient temperature is high, the output voltage from the APC circuit 12 takes on a high potential. As a result, the pulsed driving current of the differential transistor pair 1 increases, as a consequence of which the operating speed of the differential transistor pair 1 declines. However, in accordance with this embodiment of the invention, the base voltage of the transistors 6 and 7 whose common base inputs is the output of the APC circuit 12, is high. As a result, the emitter currents of the transistors 6 and 7 are increased and the operating speed of the emitter-follower transistors 2 and 3 rises to offset the decrease in the operating speed of the differential transistor pair 1. This makes it possible to maintain the speed of the optical output power waveform even at high ambient temperatures.

Thus, in accordance with the laser-diode drive circuit according to the present invention, the speed of an optical output power waveform can be maintained even if the pulsed current waveform of the laser diode changes.

As many apparently widely different embodiments of the present invention can be made without departing from the spirit and scope thereof, it is to be understood that the invention is not limited to the specific embodiments thereof except as defined in the appended claims.

What is claimed is:

1. A circuit for driving a laser diode, comprising:
 a differential transistor pair supplying said laser diode with a driving current;
 a transistor supplying said laser diode with a bias current;
 emitter-follower transistors driving said differential transistor pair;
 an automatic power control circuit outputting a control signal; and
 a driving current circuit, responsive to said control signal, for producing a pulsed driving current driving said laser diode,
 wherein said driving current circuit includes current control circuitry which compensates for changes in said pulsed driving current and operating speed fluctuations of said differential transistor pair when said control signal varies, whereby fluctuations in said operating speed of said differential transistor pair are canceled.

2. The circuit according to claim 1, wherein said current control circuitry, in a case where said pulsed driving current of said differential transistor pair increases or decreases so that operating speed of said differential transistor pair decreases or increases, includes circuitry causing said operating speed of said emitter-follower transistors to increase or decrease to cancel the amount of said decrease or increase in said operating speed of said differential transistor pair.

3. The circuit according to claim 1, wherein said current control circuitry includes current control transistors connected to said emitter-follower transistors wherein said control signal of said automatic power control circuit is supplied to base electrodes of said current control transistors.

4. A circuit for driving a laser diode, comprising:
 a differential transistor pair comprising a pair of transistors having emitter electrodes connected together;
 first and second emitter-follower transistors driving said differential transistor pair;
 a laser diode bias current supply transistor supplying said laser diode with a bias current;
 a current source transistor providing a current source for said differential transistor pair,
 an automatic power control circuit outputting a control signal;
 said laser diode;
 a collector electrode of one of the transistors of said differential transistor pair being connected, in common with a collector electrode of said bias current supply transistor, to a cathode electrode of said laser diode; and
 first and second current control transistors setting currents of said first and second emitter-follower transistors, respectively;
 wherein said laser diode bias current supply transistor, said current source transistor and said first and second current control transistors are connected to said automatic power control circuit.

5. The circuit according to claim 4, wherein said automatic power control circuit supplies said control signal to a base electrode of said current source transistor.

6. The circuit according to claim 5, wherein said current source transistor is connected to an emitter of said differential transistor pair.

* * * * *